United States Patent
Jones

(10) Patent No.: US 11,088,770 B2
(45) Date of Patent: Aug. 10, 2021

(54) MULTI-PANEL BASE STATION TEST SYSTEM

(71) Applicant: VIAVI Solutions Inc., San Jose, CA (US)

(72) Inventor: Adrian Jones, Letchworth (GB)

(73) Assignee: VIAVI Solutions Inc., San Jose, CA (US)

( * ) Notice: Subject to any disclaimer, the term of this patent is extended or adjusted under 35 U.S.C. 154(b) by 0 days.

(21) Appl. No.: 16/721,371

(22) Filed: Dec. 19, 2019

(65) Prior Publication Data
US 2021/0194606 A1 Jun. 24, 2021

(51) Int. Cl.
| | |
|---|---|
| H04B 17/29 | (2015.01) |
| H04B 17/00 | (2015.01) |
| H01Q 21/24 | (2006.01) |
| G01R 29/10 | (2006.01) |
| H04B 17/10 | (2015.01) |

(52) U.S. Cl.
CPC ........... *H04B 17/29* (2015.01); *G01R 29/105* (2013.01); *H01Q 21/24* (2013.01); *H04B 17/0085* (2013.01); *H04B 17/103* (2015.01)

(58) Field of Classification Search
CPC combination set(s) only.
See application file for complete search history.

(56) References Cited

U.S. PATENT DOCUMENTS

| | | | | |
|---|---|---|---|---|
| 2010/0285753 | A1* | 11/2010 | Foegelle | H04B 17/21 455/67.12 |
| 2015/0123672 | A1* | 5/2015 | Ao | G01R 31/001 324/512 |
| 2017/0012714 | A1* | 1/2017 | Kildal | G01R 29/0821 |
| 2018/0006745 | A1* | 1/2018 | Vanwiggeren | H04B 17/354 |
| 2018/0212695 | A1 | 7/2018 | Kyrolainen et al. | |
| 2019/0036621 | A1* | 1/2019 | Vanwiggeren | H04B 17/354 |

FOREIGN PATENT DOCUMENTS

| | | |
|---|---|---|
| EP | 2283580 A1 | 2/2011 |
| JP | 2018074544 A | 5/2018 |
| WO | 2018116258 A2 | 6/2018 |

OTHER PUBLICATIONS

Extended European Search Report for Application No. EP20214464.8, dated May 7, 2021, 8 pages.

* cited by examiner

*Primary Examiner* — Junpeng Chen
(74) *Attorney, Agent, or Firm* — Harrity & Harrity, LLP

(57) ABSTRACT

A multi-panel base station test system includes a base station radio unit configured with a plurality of antenna panels positioned at a first end of a test chamber of the multi-panel base station test system. The multi-panel base station test system includes a plurality of test antennas positioned at a second end of the test chamber opposing the first end. The multi-panel base station test system includes a microwave lens positioned between the plurality of antenna panels and the plurality of test antennas in the test chamber. The microwave lens is configured to focus respective beams transmitted from each of the plurality of antenna panels toward respective focal points associated with each of the plurality of test antennas based on steering of the plurality of antenna panels.

20 Claims, 8 Drawing Sheets

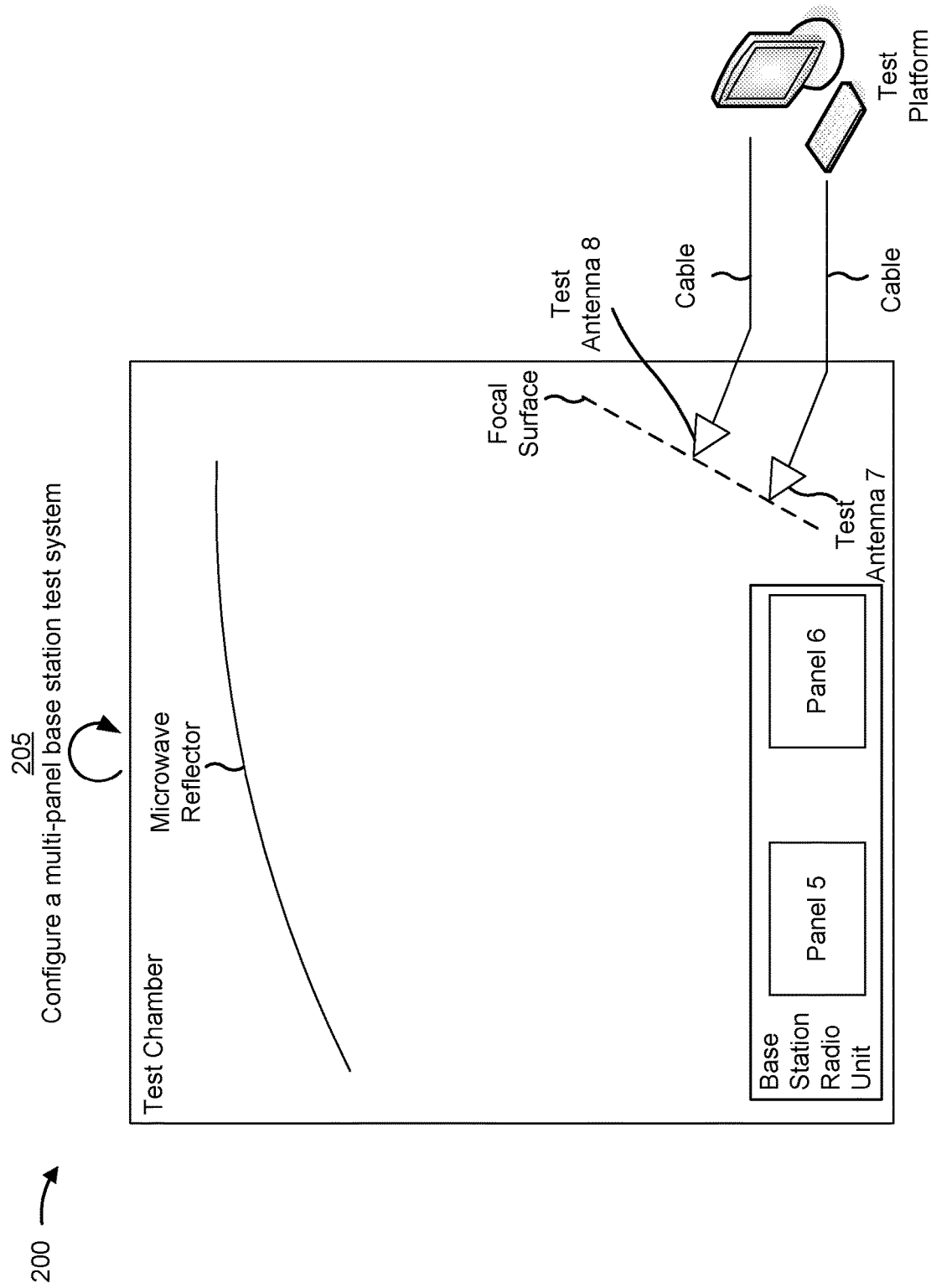

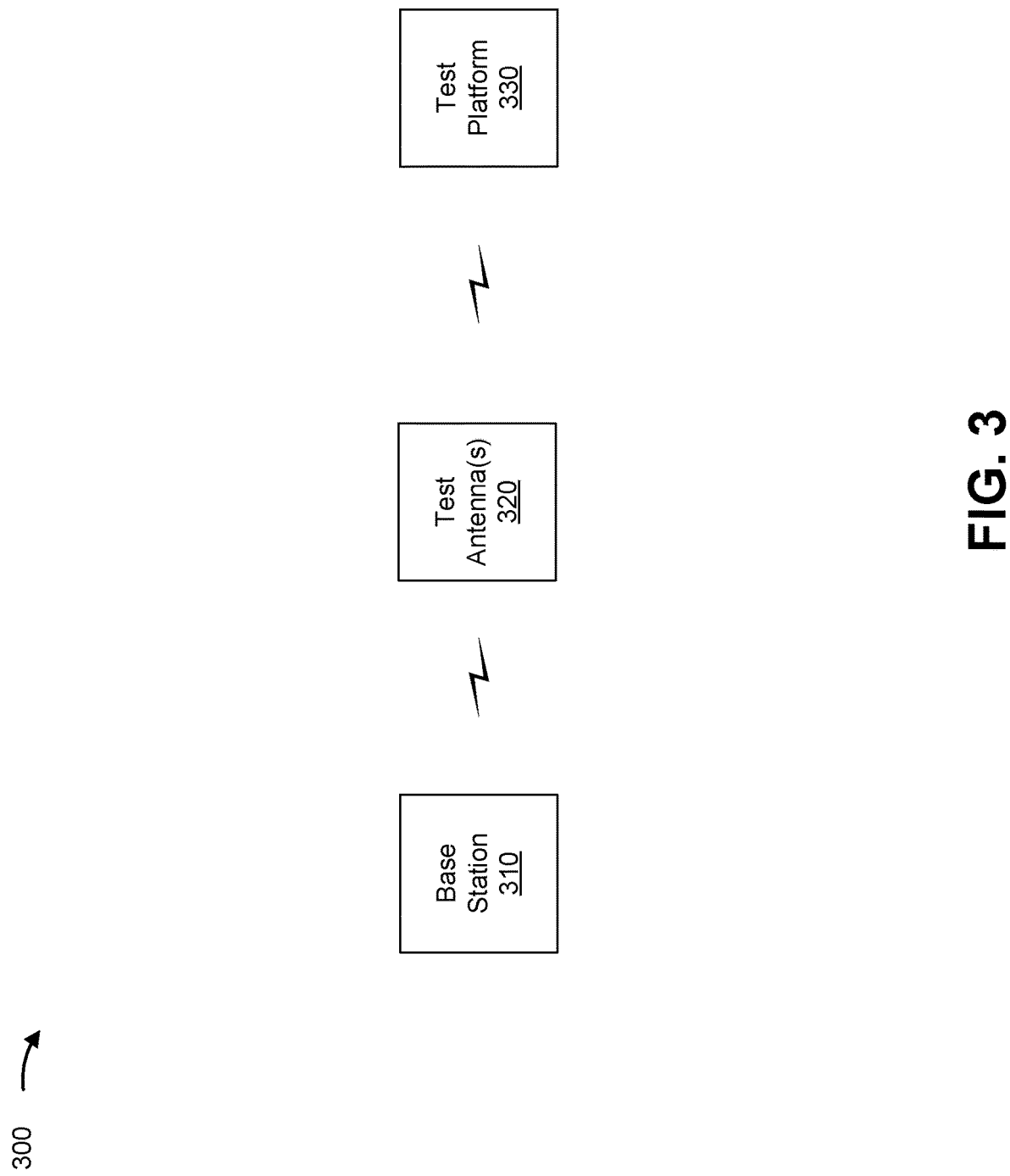

MULTI-PANEL BASE STATION TEST SYSTEM

BACKGROUND

Over the air (OTA) testing is a method used to predict the performance and reliability of a base station, a user equipment, and/or other wireless equipment in the real world. An OTA test may include placing a base station radio unit in a free space environment inside a test chamber in which actual deployment conditions are simulated, and collecting test data via one or more test antennas.

SUMMARY

According to some implementations, a multi-panel base station test system may include a base station radio unit configured with a plurality of antenna panels positioned at a first end of a test chamber; a plurality of test antennas positioned at a second end of the test chamber opposing the first end; and a microwave lens positioned between the plurality of antenna panels and the plurality of test antennas in the test chamber, wherein the microwave lens is configured to focus respective beams transmitted from each of the plurality of antenna panels toward respective focal points associated with each of the plurality of test antennas based on steering of the plurality of antenna panels.

According to some implementations, a method may include transmitting a first beam from a first antenna panel of a base station, wherein the first antenna panel is positioned to direct the first beam to a far field focal point; transmitting a second beam from a second antenna panel from the base station, wherein the second antenna panel is positioned to direct the second beam to the far field focal point; focusing, using a microwave lens, the first beam and the second beam on a near field focal point associated with a test antenna; and performing one or more measurements of the first beam and the second beam received at the test antenna.

According to some implementations, a multi-panel base station test system may include a base station radio unit configured with a plurality of antenna panels positioned in a test chamber; a plurality of test antennas positioned adjacent to the plurality of antenna panels in the test chamber; and a microwave reflector positioned to focus respective beams transmitted from each of the plurality of antenna panels toward respective focal points associated with each of the plurality of test antennas based on steering of the plurality of antenna panels.

BRIEF DESCRIPTION OF THE DRAWINGS

FIGS. 1A, 1B, 2A, and 2B are diagrams of one or more example implementations described herein.

FIGS. 3 and 4 are diagrams of example environments in which systems and/or methods described herein may be implemented.

DETAILED DESCRIPTION

Figure 1A:
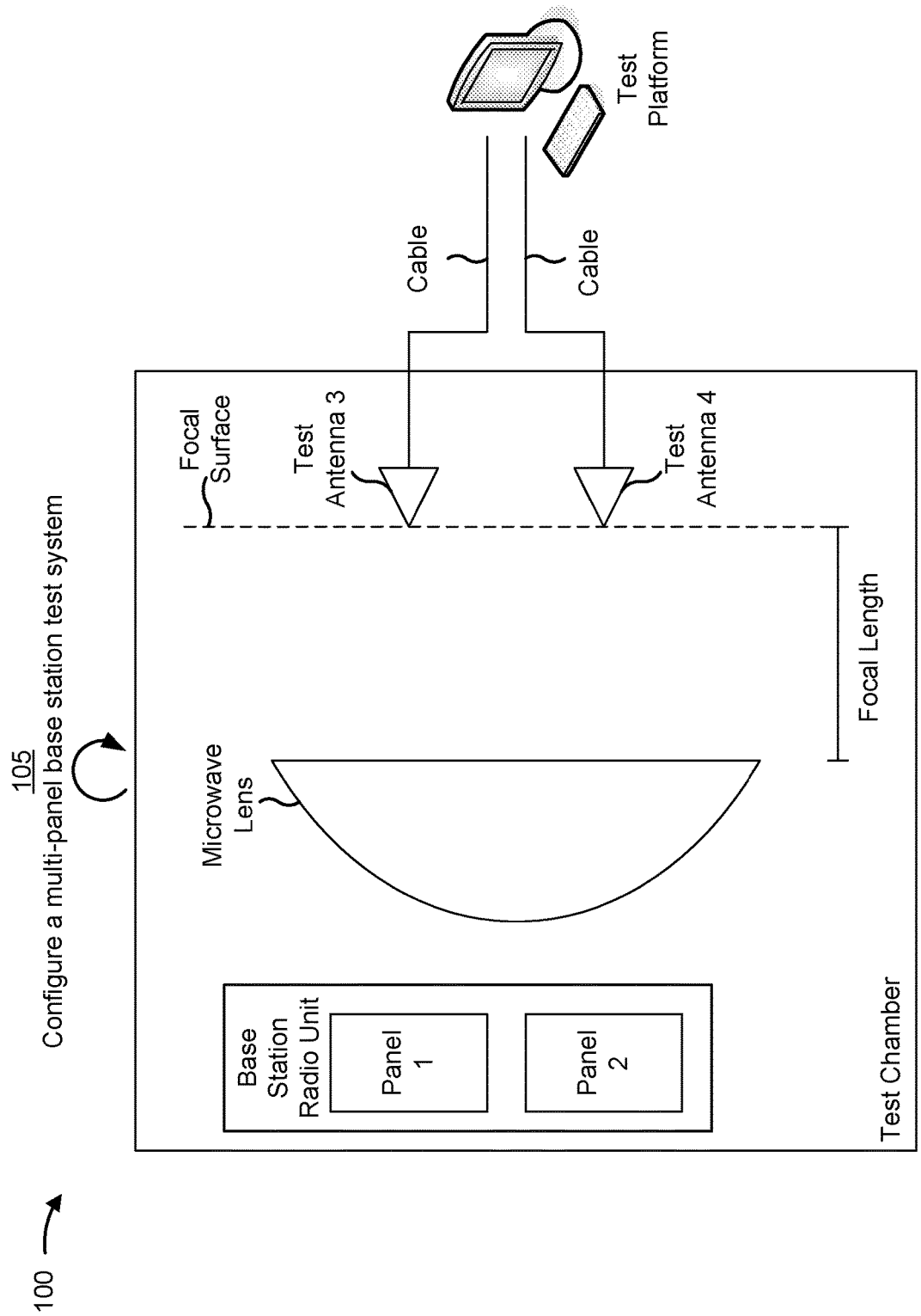

The following detailed description of example implementations refers to the accompanying drawings. The same reference numbers in different drawings may identify the same or similar elements.

A fifth generation (5G) base station radio unit may include a plurality of antenna panels and may be capable of transmitting at very high frequencies, such as 28 gigahertz (GHz), 39 GHz, and/or other centimeter and millimeter wave (mmWave) frequencies included in 5G frequency range 2 (FR2). The base station radio unit may be capable of performing beam steering, where beams transmitted from the antenna panels are steered in a particular spatial direction. In an actual deployment of a base station radio unit, wireless devices (e.g., user equipment, other base station radio units, and/or the like) that communicate with the base station radio unit may typically be positioned far enough from the base station radio unit such that the wireless devices are located in the far field of the beams transmitted from the antenna panels of the base station radio unit. This distance permits a wireless device to receive intended signals or beams from each of the antenna panels.

In an OTA test scenario, the size of the test chamber or test facility in which an OTA test is to be performed may not be large enough to permit test antennas (e.g., antennas that are used to simulate/emulate a wireless device) to be positioned far enough from the base station radio unit so that the test antennas are located in the far field of the beams transmitted from the antenna panels of the base station radio unit. In order for the OTA test to be performed, these size constraints cause test engineers and/or other test personnel to place the test antennas closer to the base station radio unit, which cause the test antennas to be located in the near field of the beams transmitted from the antenna panels. As a result, the test antenna may be positioned too close to the base station radio unit to receive all of the intended beams from the antenna panels. As a result, in some cases the base station radio unit may be unable to focus more than one panel at a time on the test antenna in the near field. In other cases, the test antenna may miss intended beams while receiving interference from an unintended beam, due to beam management protocol assuming the far field conditions exist. Either of these cases can cause erroneous and/or degraded test results, which decreases the efficacy of the OTA test.

Some implementations described herein provide a multi-panel base station test system and techniques for executing tests therein. In some implementations, a microwave lens or microwave reflector may be used to focus beams transmitted from a plurality of antenna panels of a base station radio unit at one or more test antennas located in the near field of the antenna panels. In this case, the antenna panels may each be configured to transmit a beam to a far field focal point as in a typical deployment of the base station radio unit. The microwave lens or microwave reflector may be used to focus the beams intended for the far field focal points to a near field focal point at which the one or more test antennas are located.

In this way, the multi-panel base station test system may be used in a test chamber or test facility that would otherwise be too small to perform an OTA test of the multi-panel base station test system. The microwave lens or microwave reflector reduces the physical size taken up by the multi-panel base station test system and increases flexibility of the multi-panel base station test system in that the microwave lens or microwave reflector may be designed, constructed, and/or configured to permit the multi-panel base station test system to be used in various sizes of test chambers or test facilities, and/or the like. Moreover, the microwave lens or microwave reflector increases the efficacy of the OTA tests performed in the multi-panel base station test system, which permits the results of the OTA tests to be used to modify, optimize, and/or otherwise improve the performance of the base station radio unit in an actual deployment.

Figure 1B:
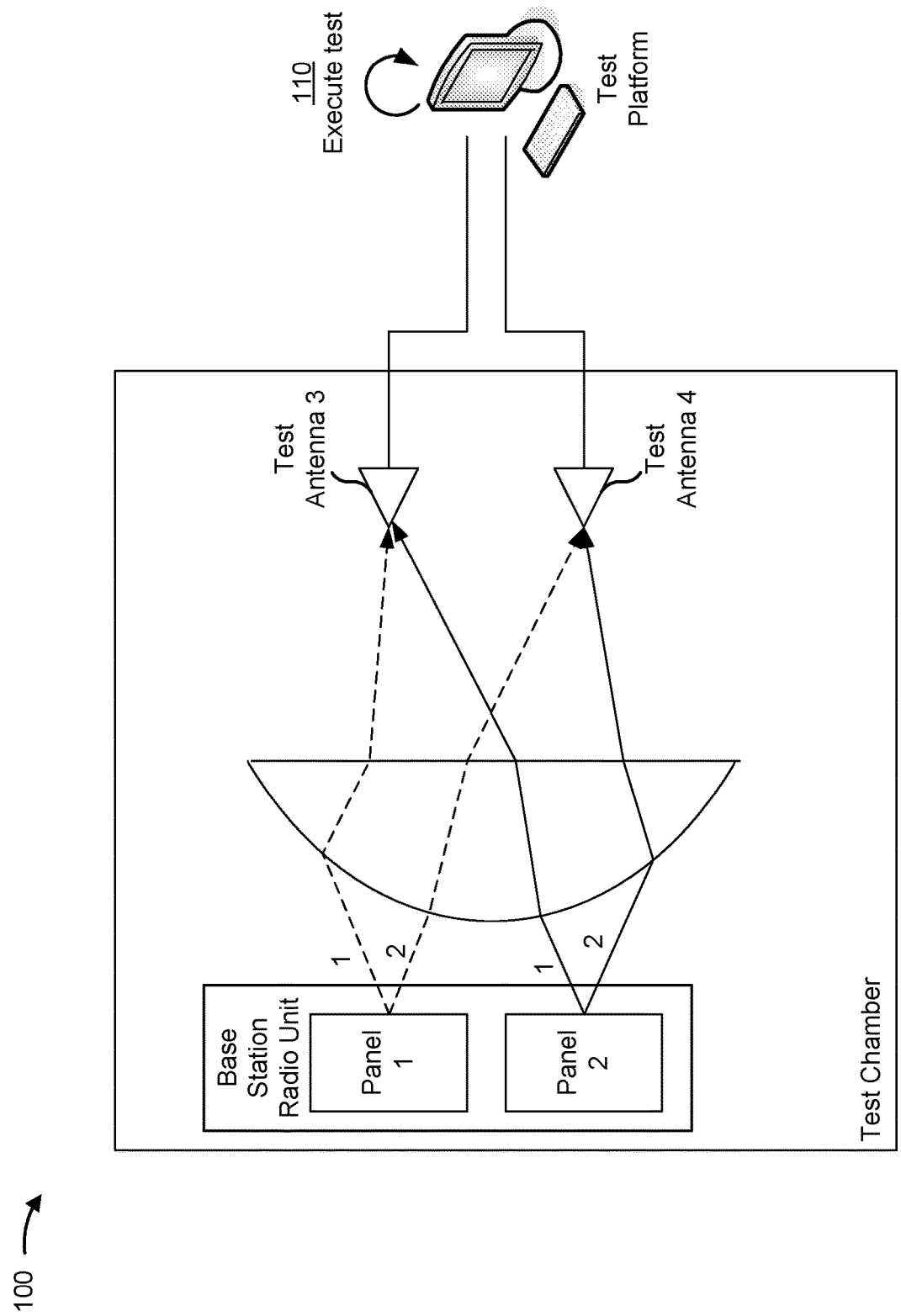

FIGS. 1A and 1B are diagrams of one or more example implementations 100 described herein. As shown in FIGS. 1A and 1B, example implementation(s) 100 may include a multi-panel base station test system. The multi-panel base station test system may be a test system that is capable of executing an OTA test of a simulated multi-panel base station deployment. The test results of the OTA test may be used to modify and/or otherwise improve one or more aspects of the multi-panel base station deployment.

As shown in FIG. 1A, the multi-panel base station test system may include various components, devices, and/or the like, such as a base station radio unit, a microwave lens, one or more test antennas (e.g., test antenna 3, test antenna 4, and/or the like), a test platform, one or more cables that communicatively connect the one or more test antenna to the test platform, and/or the like. In some implementations, the base station radio unit, the microwave lens, and one or more test antennas may be positioned inside of a test chamber. The test chamber may be an enclosed anechoic test chamber or another type of test chamber that is lined and/or configured with absorbing material to reduce signal reflections off of the walls, floor, and/or ceiling of the test chamber to more accurately simulate an actual open-air base station deployment. In some implementations, the internal dimensions of the test chamber may be 1.5 meters long or less by 1.5 meters wide or less. In some implementations, other dimensions of test chambers may be used.

The base station radio unit may include one or more wireless communication components and/or devices of a base station. For example, the base station radio unit may include one or more transmit chain components, one or more transmit processors, one or more digital-to-analog conversion components, one or more modulators, and/or the like that are capable of receiving an input stream of digital information and converting the input stream of digital information to analog radio frequency (RF) signals that may be wirelessly transmitted over the air. The base station radio unit may further include a plurality of antenna panels (e.g., panel 1, panel 2, and/or the like, which may also be referred to as antenna arrays), which may wirelessly transmit the RF signals on one or more beams. Each antenna panel may include a plurality of antenna elements or antennas.

In some implementations, the base station radio unit may be 5G base station radio unit. In this case, the plurality of antenna panels may be capable of transmitting at very high frequencies, such as 28 GHz, 38 GHz, and/or other centimeter and mmWave frequency bands included in 5G FR2. Moreover, each of the plurality of antenna panels may be capable of transmitting on a respective beam.

In some implementations, the one or more test antennas may include one or more components and/or devices capable of receiving wireless RF signals transmitted from the base station radio unit and providing the wireless RF signals to the test platform via one or more cables. The one or more cables may be run through a wall (or a port in a wall) of the test chamber, which permits the test platform to be positioned outside of the test chamber.

The test platform may include one or more components and/or devices capable of receiving wireless RF signals from the one or more test antennas, capable of demodulating the wireless RF signals, capable of performing one or more measurements of the wireless RF signals received at the one or more test antennas, and/or the like. In some implementations, the test platform may include a 5G user equipment (UE) emulator that emulates or simulates one or more UEs.

The microwave lens may be a lens that is designed, constructed, and/or configured to focus beams transmitted from the antenna panels of the base station radio unit using diffraction and/or refraction. In this case, the microwave lens may be capable of focusing high frequency (e.g., centimeter wave or mmWave) beams. In some implementations, the microwave lens may be designed and constructed to be physically larger than the surface of the base station that includes the antenna panels, the surface of the base station radio unit, or the entire combined surface of the antenna panels. As an example, the microwave lens may be designed and constructed to be 25% larger than the surface of the base station that includes the antenna panels, the surface of the base station radio unit, or the entire combined surface of the antenna panels to reduce the effect of diffraction at the edges of the microwave lens. In some implementations, the microwave lens may be designed and constructed to be truncated into a rectangular shape to match the base station radome.

In some implementations, the microwave lens may be physically attached to the base station (or base station radio unit) and may even touch the radome. In some implementations, some spacing (e.g. 100 mm) between the microwave lens and base station radio unit may be provided to reduce detuning and interaction with the antenna panels. In some implementations, the microwave lens may be physically attached to a focal point as an assembly in order to constrain the critical focal geometry. In some cases, such as in a 5G base station with automatic beam selection, the effect of focal positioning errors may be less severe as the system automatically selects the strongest beam. In some implementations, the microwave lens may be designed to be asymmetric, with the focal point offset from the center, which may assist with convenient mounting.

The microwave lens may be formed or constructed of various organic or synthetic materials, such as plastics, polymers, and/or the like. In some implementations, the microwave lens may be formed or constructed of polytetrafluoroethylene (PTFE), high-density polyethylene (HDPE) resin, nylon, polystyrene, acrylonitrile butadiene styrene (ABS), polylactic acid (PLA), polyvinyl chloride (PVC), and/or the like. In some implementations, the microwave lens may be formed or constructed of one or more materials having a dielectric constant in the range of 2.1-4.0.

The microwave lens may be formed or constructed of various shapes or types of lenses. For example, the microwave lens may be, a half circle shape, a semicircle shape, or another type of spherical lens. As another example, the microwave lens may be an aspherical lens. As another example, the microwave lens may be a hyperbolic lens, a biconvex or biconcave lens, a plano-convex or plano-concave lens, a positive or negative meniscus lens, and/or the like. In some implementations, the microwave lens may be a Gaussian lens, a double Gaussian lens, or another type of compound lens system that includes a plurality of lenses. In some implementations, to reduce the size of the microwave lens, the microwave lens may be stepped, ridged, zoned, or another type of composite lens. Examples include a Fresnel lens having two or more steps or ridges, a Fresnel lens having a graded dielectric constant based on a non-uniform density, a zoned plano-convex hyperbolic lens, one or more zoned plates (e.g., binary zoned plates, graded zoned plates, and/or the like), and/or the like. Another example is a spherical or planar Rotman lens, which has the advantage of good focus over a wide range of scanning angles. The lens may be broken into multiple pieces associated with each panel.

As shown in FIG. 1A, and by reference number 105, example implementation(s) 100 may include configuring the multi-panel base station test system. In some implementations, configuring the multi-panel base station test system may include configuring the placement of the various components and/or devices of the multi-panel base station test system within and/or external to a test chamber. For example, configuring the multi-panel base station test system may include positioning the base station radio unit at a first end of the test chamber, positioning the one or more test antennas at a second end of the test chamber opposing the first end, and positioning the microwave lens between the base station radio unit and the one or more test antennas. As another example, configuring the multi-panel base station test system may include positioning the test platform outside of the test chamber and connecting the test platform to the one or more test antennas by one or more cables through an interconnect port in a wall of the test chamber.

In some implementations, the base station radio unit may be mounted on a structure such as a bracket or pole that permits the base station radio unit (and thus, panel 1 and panel 2) to be turned or rotated in one or more directions. Panel 1 and panel 2 may each be configured to transmit a beam (e.g., a beam in a 28 GHz frequency band or another FR2 mmWave frequency band) in a spatial direction. The panel 1 and panel 2 may be spaced apart (e.g., by approximately 150 millimeters) by feeding multiple signals to the antenna elements, each of which corresponds to a different direction from each panel. In some implementations, panel 1 and panel 2 may be configured to operate on the same component carrier such that the beams transmitted from panel 1 and panel 2 may be the same frequency. In some implementations, panel 1 and panel 2 may be configured to operate on different component carriers such that the beams transmitted from panel 1 and panel 2 may be different frequencies.

Each of the plurality of antenna panels may be configured with a polarization. For example, panel 1 may be configured with a vertical polarization, panel 2 may be configured with a horizontal polarization, and/or the like. The one or more test antennas may be dual polarized in that the polarization of any particular test antenna may be configured to match the polarization of a plurality of antenna panels. For example, test antenna 3 may be polarized to align with the vertical polarization of panel 1 and the horizontal polarization of panel 2.

In some implementations, the distance between the plurality of antenna panels and the one or more test antennas may be significantly less than the far field Fraunhofer distance of the plurality of antenna panels (e.g., the distance at which the beams transmitted from the plurality of antenna panels transitions from near field properties to far field properties, $2D^2/\lambda$, where D is the largest extent across the antenna panels), in which case the one or more test antennas may be located in the near field of the plurality of antenna panels. As an example, the distance between the plurality of antenna panels and the one or more test antennas may be 1 meter whereas the far field Fraunhofer distance may be 6 meters or greater. Panel 1 and panel 2 may each be configured to transmit a respective beam as if panel 1 and panel 2 were transmitting to a wireless device in the far field of the respective beams.

In some implementations, the one or more test antennas (e.g., test antenna 3 and test antenna 4) may be positioned or spaced apart in the test chamber so that various transmission directions or electrical steering of panel 1 and panel 2 may be tested. The microwave lens may be positioned to focus the beams transmitted from panel 1 and panel 2 on a focal surface that corresponds to a focal length of the microwave lens based on the steering of panel 1 and panel 1. For example, the microwave lens may focus the beams transmitted from panel 1 and panel 2 on the focal surface at the location of test antenna 3 when panel 1 and panel 2 are steered to transmit in a first direction, and may focus the beams transmitted from panel 1 and panel 2 on the focal surface at the location of test antenna 3 when panel 1 and panel 2 are steered to transmit in a second direction. Moreover, the microwave lens may be positioned to reduce reflections of the beams transmitted from panel 1 and panel 2.

Test antenna 3 and test antenna 4 may be positioned on the focal surface so that test antenna 3 and test antenna 4 are located at or near a near field focal point of the beams transmitted from panel 1 and panel 2 as focused by the microwave lens. The focal length of the microwave lens may be based on the size of the lens (e.g., the diameter of the microwave lens, the thickness of the microwave lens, and/or the like), the diffractive and/or refractive properties of the microwave lens, the spacing between the microwave lens and panel 1 and panel 2, and/or the like. In some implementations, the spacing between the microwave lens and panel 1 and panel 2 may be configured such that the microwave lens is within a scanning angle range of panel 1 and panel 2 (e.g., an angle range in which panel 1 and panel 2 is permitted to scan electrically by the signals applied to the antenna elements of the antenna panels, or in receive mode by the weightings applied before combining the antenna elements of the antenna panels).

As shown in FIG. 1B, and by reference number 110, with the multi-panel base station test system configured, the test platform may execute a test of the multi-panel base station test system. To execute the test (e.g., an OTA test), the test platform may cause the base station radio unit to transmit a respective beam from panel 1 and panel 2. As shown in FIG. 1B, panel 1 may transmit a first beam and panel 2 may transmit a second beam in a first direction (indicated by a "1" in FIG. 1B). Panel 1 and panel 2 may each be positioned or electrically steered such that the respective beams are directed to a far field focal point. The test may further include using the microwave lens to focus the first beam and the second beam from the far field focal point to a near field focal point associated with test antenna 3 based on the steering or transmission direction of panel 1 and panel 2. For example, if panel 1 and panel 2 are steered to transmit in the first direction, the positioning of the microwave lens relative to panel 1, panel 2, and test antenna 3, and the diffractive and/or refractive properties of the microwave lens, may cause the first beam and the second beam to be directed to a near field focal point associated with test antenna 3.

As further shown in FIG. 1B, panel 1 may transmit a third beam and panel 2 may transmit a fourth beam in a second direction (indicated by a "2" in FIG. 1B). Panel 1 and panel 2 may each be positioned or electrically steered such that the respective beams are directed to a far field focal point. The test may further include using the microwave lens to focus the third beam and the fourth beam from the far field focal point to a near field focal point associated with test antenna 4 based on the steering or transmission direction of panel 1 and panel 2. For example, if panel 1 and panel 2 are steered to transmit in the second direction, the positioning of the microwave lens relative to panel 1, panel 2, and test antenna 4, and the diffractive and/or refractive properties of the microwave lens, may cause the third beam and the fourth beam to be directed to a near field focal point associated with test antenna 4.

In some implementations, the test may further include performing one or more measurements of the first beam, the second beam, the third beam, and/or the fourth beam received at the one or more test antennas. For example, the test platform may perform one or more measurements of the wireless RF signals received on the first beam and the second beam at test antenna 3, may perform one or more measurements of the wireless RF signals received on the third beam and the fourth beam at test antenna 4, and/or the like. The one or more measurements may include, for example, one or more signal to noise ratio (SNR) measurements, one or more signal to interference plus noise ratio (SINR) measurements, one or more reference signal received power (RSRP) measurements, one or more received signal strength indicator (RSSI) measurements, one or more reference signal received quality (RSRQ) measurements, one or more throughput measurements, one or more latency measurements, system capacity simulations, and/or other types of measurements.

In this way, the multi-panel base station test system may be used in a test chamber or test facility that would otherwise be too small to perform an OTA test of the multi-panel base station test system. The microwave lens reduces the physical size taken up by the multi-panel base station test system and increases flexibility of the multi-panel base station test system in that the microwave lens may be designed, constructed, and/or configured to permit the multi-panel base station test system to be used in various sizes of test chambers or test facilities, and/or the like. Moreover, the microwave lens increases the efficacy of the OTA tests performed in the multi-panel base station test system, which permits the results of the OTA tests to be used to modify, optimize, and/or otherwise improve the performance of the base station radio unit in an actual deployment. In addition, the microwave lens may permit the base station radio unit to transmit multiple beams from multiple panels using the same time-frequency resources in a way that permits the beams to be spatially multiplexed.

In some implementations, the multi-panel base station test system may be bidirectional and reciprocal. In this case, wireless RF signals transmitted from the test antennas are converted to a plane wave by the microwave lens, which simulates far field conditions at the base station radio unit surface and/or antenna panels, and distributes the signal evenly across the antenna panels. This reciprocal property may be used in wireless testing. For example, transmissions from the antenna panels to the test antennas through the microwave lens may be used to test a downlink direction, and transmissions from the test antennas to the antenna panels through the microwave lens may be used to test an uplink direction. The techniques and/or properties described herein may apply similar to the uplink direction and downlink direction.

As indicated above, FIGS. 1A and 1B are provided merely as one or more examples. Other examples may differ from what is described with regard to FIGS. 1A and 1B. For example, the base station radio unit may include a greater quantity of antenna panels than the quantity of antenna panels illustrated in FIGS. 1A and 1B. As another example, the multi-panel base station test system may include greater or few quantity of test antennas than the quantity of test antennas illustrated in FIGS. 1A and 1B.

Figure 2B:
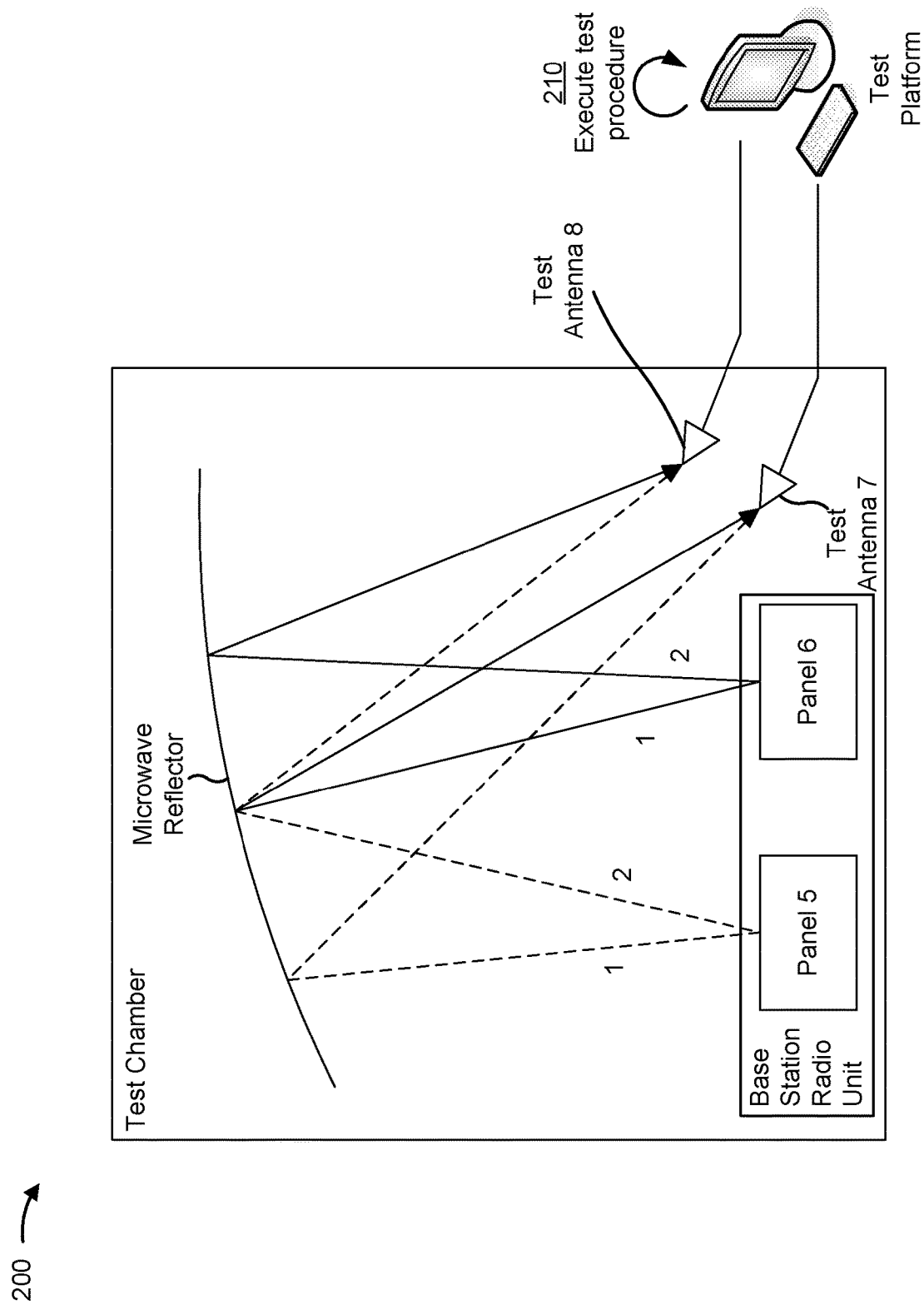

FIGS. 2A and 2B are diagrams of one or more example implementations 200 described herein. As shown in FIGS. 2A and 2B, example implementation(s) 200 may include a multi-panel base station test system. The multi-panel base station test system may be a test system that is capable of executing an OTA test of a simulated multi-panel base station deployment. The test results of the OTA test may be used to modify and/or otherwise improve one or more aspects of the multi-panel base station deployment.

As shown in FIG. 2A, the multi-panel base station test system may include various components, devices, and/or the like, such as a base station radio unit, a microwave reflector, one or more test antennas (e.g., test antenna 7, test antenna 8, and/or the like), a test platform, one or more cables that communicatively connect the one or more test antenna to the test platform, and/or the like. In some implementations, the multi-panel base station test system may include a two-stage (or more) microwave reflector. This may permit a more convenient siting of the test antennas and hence a more compact multi-panel base station test system.

In some implementations, the base station radio unit, the microwave reflector, and one or more test antennas may be positioned inside of a test chamber. The test chamber may be an enclosed anechoic test chamber or another type of test chamber that is lined and/or configured with absorbing material to reduce signal reflections off of the walls, floor, and/or ceiling of the test chamber to more accurately simulate an actual open-air base station deployment. In some implementations, the internal dimensions of the test chamber may be 1.5 meters long or less by 1.5 meters wide or less. In some implementations, other dimensions of test chambers may be used. In some implementations, the use of a microwave reflector may permit the multi-panel base station test system to be used in even smaller test chambers because the reflective properties of the microwave reflector may permit one or more test antennas to be more closely positioned to the base station radio unit.

The base station radio unit may include one or more wireless communication components and/or devices of a base station. For example, the base station radio unit may include one or more transmit chain components, one or more transmit processors, one or more digital-to-analog conversion components, one or more modulators, and/or the like that are capable of receiving an input stream of digital information and converting the input stream of digital information to wireless RF signals that may be wirelessly transmitted over the air. The base station radio unit may further include a plurality of antenna panels (e.g., panel 5, panel 6, and/or the like), which may wirelessly transmit the RF signals on one or more beams. Each antenna panel may include a plurality of antenna elements or antennas.

In some implementations, the base station radio unit may be 5G base station radio unit. In this case, the plurality of antenna panels may be capable of transmitting at very high frequencies, such as 28 GHz, 39 GHz, and/or other centimeter and mmWave frequency bands included in 5G FR2. Moreover, each of the plurality of antenna panels may be capable of transmitting on a respective beam.

In some implementations, the one or more test antennas may include one or more components and/or devices capable of receiving and demodulating wireless RF signals transmitted from the base station radio unit. Moreover, the one or more test antennas may include one or more components and/or devices capable of providing digital information resulting from the demodulation of the wireless RF signals to the test platform via the one or more cables. The one or more cables may be run through a wall (or a port in a wall) of the test chamber, which permits the test platform to be positioned outside of the test chamber. The test platform may include one or more components and/or devices capable of performing one or more measurements of the wireless RF signals received at the one or more test antennas, capable of performing one or more measurements of the digital information received from the one or more test antennas, and/or the like.

The microwave reflector may be a reflector that is designed, constructed, and/or configured to focus beams transmitted from the antenna panels of the base station radio unit using reflection. In this case, the microwave lens may be capable of focusing high frequency (e.g., centimeter wave or mmWave) beams. The microwave reflector may be formed or constructed of various organic or synthetic materials, such as plastics, polymers, and/or the like. In some implementations, the microwave reflector may be formed or constructed of one or more metal materials, one or more types of metals (e.g., solid metals, perforated metals, and/or the like), and/or the like. In some implementations, the microwave reflector may be formed by a printed circuit board (PCB) process. In some implementations, the microwave reflector may be formed into a parabolic shape to reflect wireless RF signals. In some implementations, the microwave reflector may be a one or more binary or graded zone plates. In this case, a reflective zone plate may be flat and may be patterned to cause reflections to converge on a focal point. As shown in FIG. 2A, and by reference number 205, example implementation(s) 200 may include configuring the multi-panel base station test system. In some implementations, configuring the multi-panel base station test system may include configuring the placement of the various components and/or devices of the multi-panel base station test system within and/or external to a test chamber. For example, configuring the multi-panel base station test system may include positioning the base station radio unit in the test chamber, positioning the one or more test antennas in the test chamber adjacent to the base station radio unit or in another location in which beams transmitted from the plurality of antenna panels may be directed to the one or more test antennas, and positioning the microwave reflector in the test chamber to focus the beams transmitted from the plurality of antenna panels toward respective focal points of the one or more test antennas using reflection. As another example, configuring the multi-panel base station test system may include positioning the test platform outside of the test chamber and connecting the test platform to the one or more test antennas by one or more cables through an interconnect port in a wall of the test chamber.

In some implementations, the base station radio unit may be mounted on a structure such as a bracket or pole that permits the base station radio unit (and thus, panel 5 and panel 6) to be turned or rotated in one or more directions. Panel 5 and panel 6 may each be configured to transmit a beam (e.g., a beam in a 28 GHz frequency band or another FR2 mmWave frequency band) in a spatial direction. Panel 5 and panel 6 may be spaced apart (e.g., by approximately 150 millimeters) by feeding multiple signals to the antenna elements, each of which corresponds to a different direction from each panel. In some implementations, panel 5 and panel 6 may be configured to operate on the same component carrier such that the beams transmitted from panel 5 and panel 6 may be the same frequency. In some implementations, panel 5 and panel 6 may be configured to operate on different component carriers such that the beams transmitted from panel 5 and panel 6 may be different frequencies.

Each of the plurality of antenna panels may be configured with a polarization. For example, panel 5 may be configured with a vertical polarization, panel 6 may be configured with a horizontal polarization, and/or the like. The one or more test antennas may be dual polarized in that the polarization of any particular test antenna may be configured to match the polarization of a plurality of antenna panels. For example, test antenna 7 may be polarized to align with the vertical polarization of panel 5 and the horizontal polarization of panel 6.

In some implementations, the distance between the plurality of antenna panels and the one or more test antennas (e.g., the wireless transmission distance and/or the physical distance) may be significantly less than the far field Fraunhofer distance of the plurality of antenna panels (e.g., the distance at which the beams transmitted from the plurality of antenna panels transitions from near field properties to far field properties), in which case the one or more test antennas may be located in the near field of the plurality of antenna panels. As an example, the distance between the plurality of antenna panels and the one or more test antennas may be 1 meter whereas the far field Fraunhofer distance may be 6 meters or greater. Panel 5 and panel 6 may each be configured to transmit a respective beam as if panel 5 and panel 6 were transmitting to a wireless device in the far field of the respective beams.

In some implementations, the one or more test antennas (e.g., test antenna 7 and test antenna 8) may be positioned or spaced apart in the test chamber so that various transmission directions or and electrical steering of panel 5 and panel 6 may be tested. The microwave reflector may be positioned to focus the beams transmitted from panel 5 and panel 6 on a focal surface that corresponds to a focal length of the microwave reflector based on the steering of panel 5 and panel 6. For example, the microwave reflector may focus the beams transmitted from panel 5 and panel 6 on the focal surface at the location of test antenna 7 when panel 5 and panel 6 are steered to transmit in a first direction, and may focus the beams transmitted from panel 5 and panel 6 on the focal surface at the location of test antenna 8 when panel 5 and panel 6 are steered to transmit in a second direction.

Test antenna 7 and test antenna 8 may be positioned at the focal surface so that test antenna 7 and test antenna 8 are located at or near a near field focal point of the beams transmitted from panel 5 and panel 6 as focused by the microwave reflector. The focal length of the microwave reflector may be based on the curvature of the microwave reflector, the reflective properties of the microwave reflector, the spacing between the microwave reflector and panel 5 and panel 6, and/or the like. In some implementations, the spacing between the microwave reflector and panel 5 and panel 6 may be configured such that the microwave reflector is within a scanning angle range of panel 5 and panel 6 (e.g., an angle range in which panel 5 and panel 6 is permitted to scan electrically by the signals applied to the antenna elements of the antenna panels, or in receive mode by the weightings applied before combining the antenna elements of the antenna panels).

As shown in FIG. 2B, and by reference number 210, with the multi-panel base station test system configured, the test platform may execute a test of the multi-panel base station test system. To execute the test (e.g., an OTA test), the test platform may cause the base station radio unit to transmit a respective beam from panel 5 and panel 6. As shown in FIG. 2B, panel 5 may transmit a first beam and panel 6 may transmit a second beam in a first direction (indicated by a "1" in FIG. 2B). Panel 5 and panel 6 may each be positioned or electrically steered such that the respective beams are directed to a far field focal point. The test may further include using the microwave reflector to focus the first beam and the second beam from the far field focal point to a near field focal point associated with test antenna 7 based on the steering or transmission direction of panel 5 and panel 6. For example, if panel 5 and panel 6 are steered to transmit in the first direction, the positioning of the microwave reflector relative to panel 5, panel 6, and test antenna 7, and the reflective properties of the microwave reflector may cause the first beam and the second beam to be directed to a near field focal point associated with test antenna 7.

As further shown in FIG. 2B, panel 5 may transmit a third beam and panel 6 may transmit a fourth beam in a second direction (indicated by a "2" in FIG. 2B). Panel 5 and panel 6 may each be positioned or electrically steered such that the respective beams are directed to a far field focal point. The test may further include using the microwave reflector to focus the third beam and the fourth beam from the far field focal point to a near field focal point associated with test antenna 8 based on the steering or transmission direction of panel 5 and panel 6. For example, if panel 5 and panel 6 are steered to transmit in the second direction, the positioning of the microwave lens relative to panel 5, panel 6, and test antenna 8, and the reflective properties of the microwave reflector, may cause the third beam and the fourth beam to be directed to a near field focal point associated with test antenna 8.

In some implementations, the test may further include performing one or more measurements of the first beam, the second beam, the third beam, and/or the fourth beam received at the one or more test antennas. For example, the test platform may perform one or more measurements of the wireless RF signals received on the first beam and the second beam at test antenna 7, may perform one or more measurements of the wireless RF signals received on the third beam and the fourth beam at test antenna 8, and/or the like. The one or more measurements may include, for example, one or more SNR measurements, one or more SINR measurements, one or more RSRP measurements, one or more RSSI measurements, one or more RSRQ measurements, one or more throughput measurements, one or more latency measurements, system capacity simulations, and/or other types of measurements.

In this way, the multi-panel base station test system may be used in a test chamber or test facility that would otherwise be too small to perform an OTA test of the multi-panel base station test system. The microwave reflector reduces the physical size taken up by the multi-panel base station test system and increases flexibility of the multi-panel base station test system in that the microwave reflector may be designed, constructed, and/or configured to permit the multi-panel base station test system to be used in various sizes of test chambers or test facilities, and/or the like. Moreover, the microwave reflector increases the efficacy of the OTA tests performed in the multi-panel base station test system, which permits the results of the OTA tests to be used to modify, optimize, and/or otherwise improve the performance of the base station radio unit in an actual deployment. In addition, the microwave reflector may permit the base station radio unit to transmit multiple beams from multiple panels using the same time-frequency resources in a way that permits the beams to be spatially multiplexed.

In some implementations, the multi-panel base station test system may be bidirectional and reciprocal. In this case, wireless RF signals transmitted from the test antennas are converted to a plane wave by the microwave reflector, which simulates far field conditions at the base station radio unit surface and/or antenna panels, and distributes the signal evenly across the antenna panels. This reciprocal property may be used in wireless testing. For example, transmissions from the antenna panels to the test antennas via the microwave reflector may be used to test a downlink direction, and transmissions from the test antennas to the antenna panels via the microwave reflector may be used to test an uplink direction. The techniques and/or properties described herein may apply similar to the uplink direction and downlink direction.

As indicated above, FIGS. 2A and 2B are provided merely as one or more examples. Other examples may differ from what is described with regard to FIGS. 2A and 2B. For example, the base station radio unit may include a greater quantity of antenna panels than the quantity of antenna panels illustrated in FIGS. 2A and 2B. As another example, the multi-panel base station test system may include greater or few quantity of test antennas than the quantity of test antennas illustrated in FIGS. 2A and 2B.

FIG. 3 is a diagram of an example environment 300 in which systems and/or methods, described herein, may be implemented. As shown in FIG. 3, environment 300 may include a base station 310, one or more test antennas 320, and a test platform 330. In some implementations, base station 310, test antennas 320, and test platform 330 may be included in a multi-panel base station test system. Devices of environment 300 may interconnect via wired connections, wireless connections, or a combination of wired and wireless connections. For example, base station 310 and test antennas 320 may interconnect via wireless connections, and test antennas 320 and test platform 330 may be interconnected via wired connections.

Base station 310 includes one or more devices capable of receiving an input stream of digital information and converting the input stream of digital information to analog RF signals that may be wirelessly transmitted over the air. For example, base station 310 may include a 5G base station, a Long Term Evolution (LTE) base station, a base station of a microcell, a picocell, and/or a femtocell; one or more macrocell base stations, such as an evolved NodeB (eNodeB), a next generation NodeB (gNodeB), and/or the like. In some implementations, base station 310 may include a plurality of antenna panels that are each capable of transmitting a beam in one or more spatial directions.

Test antenna 320 may include one or more devices capable of receiving beams transmitted from base station 310, capable of demodulating wireless RF signals transmitted on the beams, capable of providing digital information obtains from demodulating the wireless RF signals to test platform 330, and/or the like. In some implementations, test antenna 320 includes an RF antenna, an RF receive chain, and/or the like.

Test platform 330 includes one or more devices capable of receiving, generating, storing, and or processing information associated with a test executed in a multi-panel base station test system. For example, test platform 330 may include a mobile phone (e.g., a smart phone, etc.), a laptop computer, a tablet computer, a wearable communication device (e.g., a smart wristwatch, a pair of smart eyeglasses, etc.), a server device, a desktop computer, a cloud-based test system, a dedicated test system designed for testing base stations, and/or similar devices. In some implementations, test platform 330 may emulate or simulate one or more UEs (e.g., up to thousands of UEs). In some implementations, test platform 330 may be based on a combination of server and custom hardware and terraces to test antennas 320 through RF connectors and cables.

In some implementations, test platform 330 may cause base station 310 to transmit a first beam from a first antenna panel of base station 310, may cause base station 310 to transmit a second beam from a second antenna panel of base station 310, may focus, using a microwave lens, the first beam and the second beam on a near field focal point associated with a test antenna 320, may perform one or more measurements of the first beam and the second beam as received at test antenna 320, and/or the like.

The number and arrangement of devices and networks shown in FIG. 3 are provided as an example. In practice, there may be additional devices and/or networks, fewer devices and/or networks, different devices and/or networks, or differently arranged devices and/or networks than those shown in FIG. 3. Furthermore, two or more devices shown in FIG. 3 may be implemented within a single device, or a single device shown in FIG. 3 may be implemented as multiple, distributed devices. Additionally, or alternatively, a set of devices (e.g., one or more devices) of environment 300 may perform one or more functions described as being performed by another set of devices of environment 300.

Figure 4:
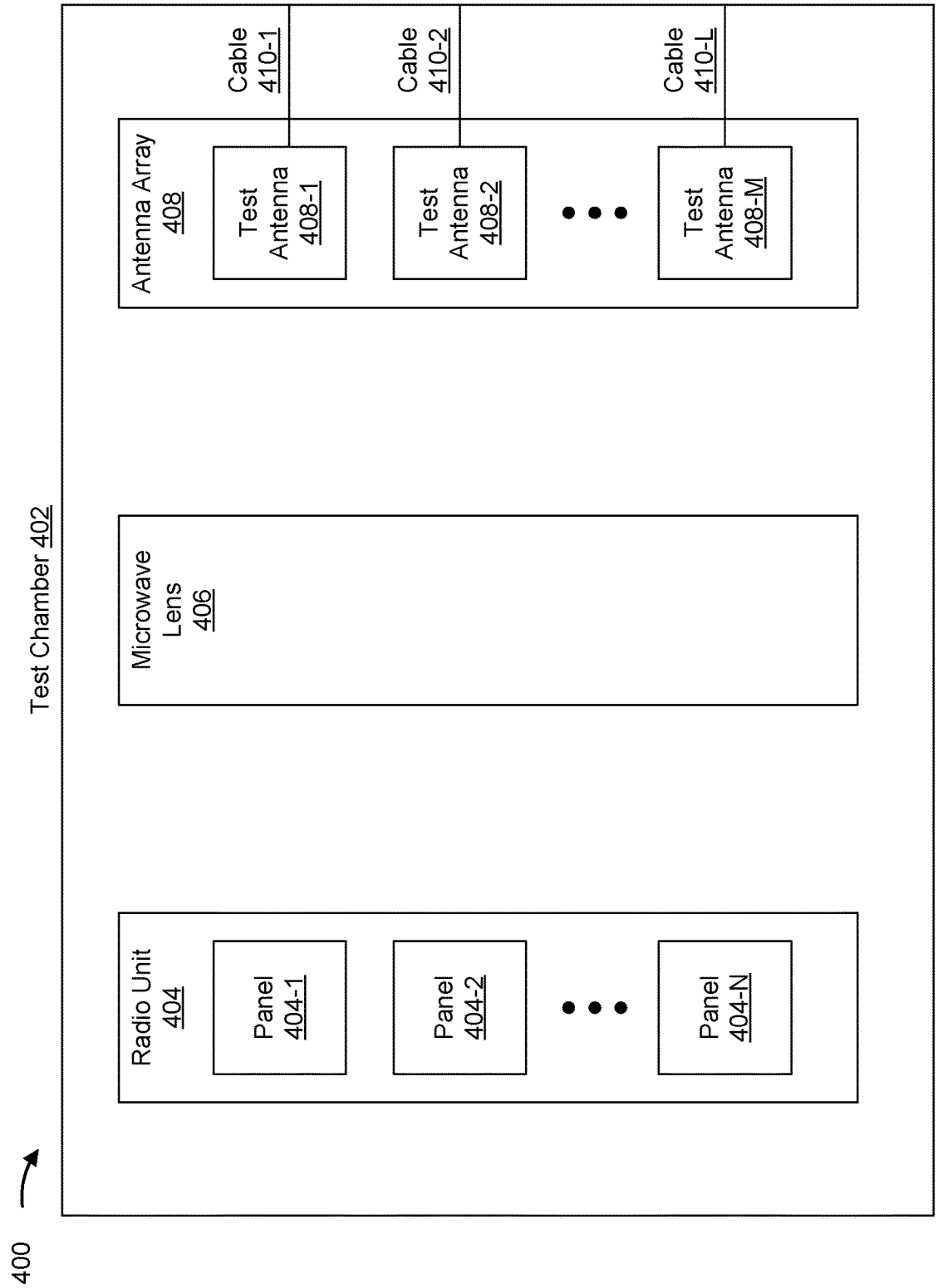

FIG. 4 is a diagram of an example environment 400 in which systems and/or methods, described herein, may be implemented. As shown in FIG. 4, environment 400 may include a test chamber 402, a radio unit 404, a microwave lens 406, an antenna array 408, and a plurality of cables 410-1 through 410-L. As further shown in FIG. 4, radio unit 404, microwave lens 406, antenna array 408, and cables 410 may be positioned within test chamber 402 and may be part of a multi-panel base station test system. Devices of environment 400 may interconnect via wired connections, wireless connections, or a combination of wired and wireless connections.

Radio unit 404 includes one or more devices capable of receiving an input stream of digital information and converting the input stream of digital information to analog RF signals that may be wirelessly transmitted over the air. For example, radio unit 404 may be a base station radio unit of a base station (e.g., base station 310) and may include a plurality of antenna panels 404-1 through 404-N. In some implementations, each of antenna panels 404-1 through 404-N may be capable of transmitting wireless RF signals on a beam.

Microwave lens 406 may include one or more devices capable of using diffractive properties and/or refractive properties to focus the beams transmitted from antenna panels 404-1 through 404-N toward one or more near field focal points of radio unit 404. For example, microwave lens 406 may be, a half circle shape, a semicircle shape, or another type of spherical lens. As another example, microwave lens 406 may be an aspherical lens. As another example, microwave lens 406 may be a hyperbolic lens, a biconvex or biconcave lens, a plano-convex or plano-concave lens, a positive or negative meniscus lens, and/or the like. In some implementations, microwave lens 406 may be a Gaussian lens, a double Gaussian lens, or another type of compound lens system that includes a plurality of lenses. In some implementations, to reduce the size of microwave lens 406, microwave lens 406 may be stepped, ridged, zoned, or another type of composite lens. In some implementations, instead of including a microwave lens 406, environment 400 may include a microwave reflector that may use reflective properties to focus the beams transmitted from antenna panels 404-1 through 404-N toward one or more near field focal points of radio unit 404.

Antenna array 408 may include one or more devices capable of receiving beams transmitted from antenna panels 404-1 through 404-N, capable of demodulating wireless RF signals transmitted on the beams, capable of providing digital information obtains from demodulating the wireless RF signals to a test platform (e.g., test platform 330) via cables 410-1 through 410-L, and/or the like. In some implementations, antenna array 408 includes a plurality of test antennas 401-1 through 408-M (e.g., test antennas 320). Cables 410-1 through 410-L may be various types of power cables, networking or communications cables, and/or the like, such as Ethernet cables, serial cables, coaxial cables, and/or the like.

The number and arrangement of devices and networks shown in FIG. 4 are provided as an example. In practice, there may be additional devices, fewer devices, different devices, or differently arranged devices than those shown in FIG. 4. Furthermore, two or more devices shown in FIG. 4 may be implemented within a single device, or a single device shown in FIG. 4 may be implemented as multiple, distributed devices. Additionally, or alternatively, a set of devices (e.g., one or more devices) of environment 400 may perform one or more functions described as being performed by another set of devices of environment 400.

Figure 5:
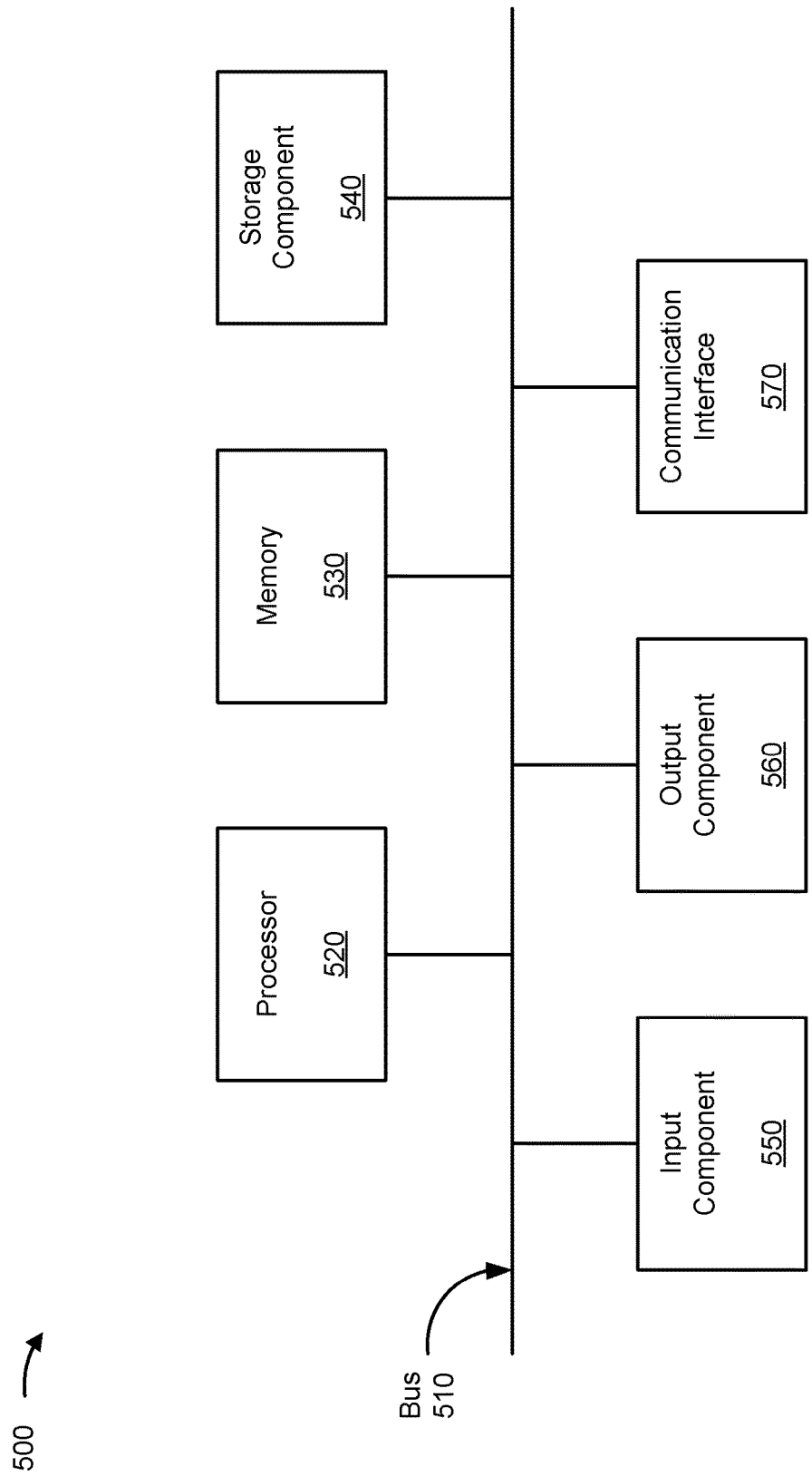
FIG. 5 is a diagram of example components of one or more devices of FIGS. 3 and 4.

FIG. 5 is a diagram of example components of a device 500. Device 500 may correspond to base station 310, test antenna 320, test platform 330, radio unit 404, panel 404-1 through panel 404-N, microwave lens 406, antenna array 408, test antenna 408-1 through test antenna 408-M, and/or the like. In some implementations, base station 310, test antenna 320, test platform 330, radio unit 404, panel 404-1 through panel 404-N, microwave lens 406, antenna array 408, test antenna 408-1 through test antenna 408-M, and/or the like may include one or more devices 500 and/or one or more components of device 500. As shown in FIG. 5, device 500 may include a bus 510, a processor 520, a memory 530, a storage component 540, an input component 550, an output component 560, and a communication interface 570.

Bus 510 includes a component that permits communication among multiple components of device 500. Processor 520 is implemented in hardware, firmware, and/or a combination of hardware and software. Processor 520 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 520 includes one or more processors capable of being programmed to perform a function. Memory 530 includes a random access memory (RAM), a read only memory (ROM), and/or another type of dynamic or static storage device (e.g., a flash memory, a magnetic memory, and/or an optical memory) that stores information and/or instructions for use by processor 520.

Storage component 540 stores information and/or software related to the operation and use of device 500. For example, storage component 540 may include a hard disk (e.g., a magnetic disk, an optical disk, and/or a magneto-optic disk), a solid state drive (SSD), a compact disc (CD), a digital versatile disc (DVD), a floppy disk, a cartridge, a magnetic tape, and/or another type of non-transitory computer-readable medium, along with a corresponding drive.

Input component 550 includes a component that permits device 500 to receive information, such as via user input (e.g., a touch screen display, a keyboard, a keypad, a mouse, a button, a switch, and/or a microphone). Additionally, or alternatively, input component 550 may include a component for determining location (e.g., a global positioning system (GPS) component) and/or a sensor (e.g., an accelerometer, a gyroscope, an actuator, another type of positional or environmental sensor, and/or the like). Output component 560 includes a component that provides output information from device 500 (via, e.g., a display, a speaker, a haptic feedback component, an audio or visual indicator, and/or the like).

Communication interface 570 includes a transceiver-like component (e.g., a transceiver, a separate receiver, a separate transmitter, and/or the like) that enables device 500 to communicate with other devices, such as via a wired connection, a wireless connection, or a combination of wired and wireless connections. Communication interface 570 may permit device 500 to receive information from another device and/or provide information to another device. For example, communication interface 570 may include an Ethernet interface, an optical interface, a coaxial interface, an infrared interface, an RF interface, a universal serial bus (USB) interface, a wireless local area network interface, a cellular network interface, and/or the like.

Device 500 may perform one or more processes described herein. Device 500 may perform these processes based on processor 520 executing software instructions stored by a non-transitory computer-readable medium, such as memory 530 and/or storage component 540. As used herein, the term "computer-readable medium" refers to a non-transitory memory device. A memory device includes memory space within a single physical storage device or memory space spread across multiple physical storage devices.

Software instructions may be read into memory 530 and/or storage component 540 from another computer-readable medium or from another device via communication interface 570. When executed, software instructions stored in memory 530 and/or storage component 540 may cause processor 520 to perform one or more processes described herein. Additionally, or alternatively, hardware circuitry may be used in place of or in combination with software instructions to perform one or more processes described herein. Thus, implementations described herein are not limited to any specific combination of hardware circuitry and software.

The number and arrangement of components shown in FIG. 5 are provided as an example. In practice, device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
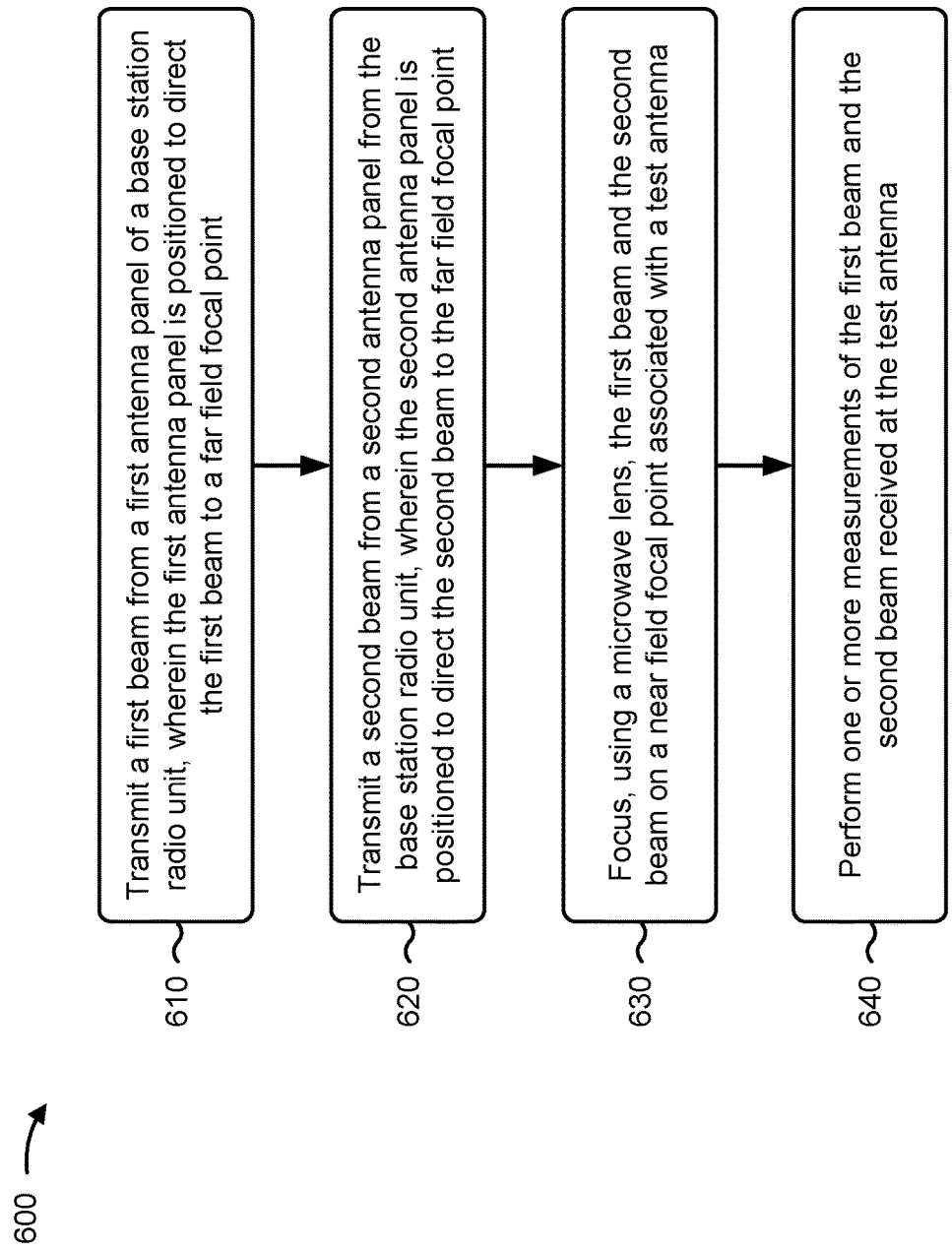
FIG. 6 is a flow chart of an example process for executing a test in a multi-panel base station test system.

FIG. 6 is a flow chart of an example process 600 for executing a test in a multi-panel base station test system. In some implementations, one or more process blocks of FIG. 6 may be performed by a test platform (e.g., test platform 330, device 500, and/or the like). In some implementations, one or more process blocks of FIG. 6 may be performed by another device or a group of devices separate from or including the test platform, such as a base station (e.g., base station 310), a test antenna (e.g., test antenna 320, test antenna 408-1 through 408-M, and/or the like), a radio unit (e.g., radio unit 404), a microwave lens (e.g., microwave lens 406), and/or the like.

As shown in FIG. 6, process 600 may include transmitting a first beam from a first antenna panel of a base station radio unit, wherein the first antenna panel is positioned to direct the first beam to a far field focal point (block 610). For example, the test platform (e.g., using processor 520, memory 530, storage component 540, input component 550, output component 560, communication interface 570 and/or the like) may cause a base station radio unit in a multi-panel base station test system to transmit a first beam from a first antenna panel of the base station radio unit, as described above. In some implementations, the first antenna panel is positioned to direct the first beam to a far field focal point.

As further shown in FIG. 6, process 600 may include transmitting a second beam from a second antenna panel from the base station radio unit, wherein the second antenna panel is positioned to direct the second beam to the far field focal point (block 620). For example, the test platform (e.g., using processor 520, memory 530, storage component 540, input component 550, output component 560, communication interface 570 and/or the like) may cause the base station radio unit to transmit a second beam from a second antenna panel of the base station radio unit, as described above. In some implementations, the second antenna panel is positioned to direct the second beam to the far field focal point.

As further shown in FIG. 6, process 600 may include focusing, using a microwave lens, the first beam and the second beam on a near field focal point associated with a test antenna (block 630). For example, the test platform (e.g., using processor 520, memory 530, storage component 540, input component 550, output component 560, communication interface 570 and/or the like) may focus, using a microwave lens, the first beam and the second beam on a near field focal point associated with a test antenna, as described above.

As further shown in FIG. 6, process 600 may include performing one or more measurements of the first beam and the second beam received at the test antenna (block 640). For example, the test platform (e.g., using processor 520, memory 530, storage component 540, input component 550, output component 560, communication interface 570 and/or the like) may perform one or more measurements of the first beam and the second beam received at the test antenna, as described above. In some implementations, the test platform may perform the one or more measurements of the first beam and/or the second beam as received at the test antenna. For example, the test platform may be communicatively connected with the test antenna via one or more cables, and the test platform may receive wireless RF signals or transmissions on the first beam and/or the second beam from the test antenna via the one or more cables. The test platform may perform the one or more measurements of the wireless RF signals or transmissions, such as one or more SNR measurements, one or more SINR measurements, one or more RSRP measurements, one or more RSSI measurements, one or more RSRQ measurements, one or more throughput measurements, one or more latency measurements, and/or other types of measurements.

Process 600 may include additional implementations, such as any single implementation or any combination of implementations described below and/or in connection with one or more other processes described elsewhere herein.

In a first implementation, the first beam transmits in a first spatial direction and the second beam transmits in a second spatial direction separated from the first spatial direction. In a second implementation, alone or in combination with the first implementation, the first antenna panel and the second antenna panel each operates in one or more 5G FR2 frequency bands. In a third implementation, alone or in combination with one or more of the first and second implementations, the microwave lens is formed of at least one of PTFE, HDPE resin, nylon, polystyrene, or acrylonitrile butadiene styrene.

In a fourth implementation, alone or in combination with one or more of the first through third implementations, the test antenna comprises a dual polarized antenna. In a fifth implementation, alone or in combination with one or more of the first through fourth implementations, the microwave lens comprises: a plurality of binary zoned plates, or a plurality of graded zoned plates. In a sixth implementation, alone or in combination with one or more of the first through fifth implementations, the microwave lens comprises a Fresnel Zoned Lens having two or more steps.

In some implementations, process 600 may be performed using a microwave reflector instead of the microwave lens. In this case, the microwave reflector may be positioned in the multi-panel base station test system to reflect the first beam and the second beam to cause the first beam and the second beam to be focused on the near-field focal point at or near the test antenna.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware may be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A base station test system, comprising:
   a base station radio unit configured with a plurality of antenna panels positioned at a first end of a test chamber,
      wherein the plurality of antenna panels includes a first antenna panel and a second antenna panel that are each configured to transmit a first beam to a first far field focal point, and to transmit a second beam to a second far field focal point;
   a plurality of test antennas positioned at a second end of the test chamber opposing the first end,
      wherein the plurality of test antennas includes a first test antenna and a second test antenna associated with a first near field focal point and a second near field focal point, respectively; and
   a microwave lens positioned between the plurality of antenna panels and the plurality of test antennas in the test chamber,
      wherein the microwave lens is configured to focus the first beam and the second beam, transmitted from both of the first antenna panel and the second antenna panel, toward the first near field focal point and the second near field focal point, respectively, based on steering of the plurality of antenna panels.

2. The base station test system of claim 1, wherein the plurality of test antennas comprises:
   a plurality of dual polarized antennas.

3. The base station test system of claim 2, wherein the first antenna panel has a vertical polarization;
   wherein the second antenna panel has a horizontal polarization; and
   wherein a dual polarized antenna of the plurality of dual polarized antennas is polarized to align with the vertical polarization of the first antenna panel and the horizontal polarization of the second antenna panel.

4. The base station test system of claim 1, wherein the microwave lens comprises:
   a hyperbolic lens,
   a Gaussian lens,
   a Fresnel lens,
   a solid hyperbolic plano-convex lens,
   a biconvex or biconcave lens,
   a plano-convex or plano-concave lens, or
   a positive or negative meniscus lens.

5. The base station test system of claim 1, wherein the microwave lens comprises:
   a Fresnel lens having a graded dielectric constant based on a non-uniform density,
   a double Gaussian lens, or
   a spherical or planar Rotman lens.

6. The base station test system of claim 1, wherein a distance between the plurality of antenna panels and the plurality of test antennas is less than a Fraunhofer distance of the plurality of antenna panels.

7. The base station test system of claim 1, wherein a distance between the base station radio unit and the plurality of test antennas is less than 1.5 meters.

8. A method, comprising:
   transmitting a first beam and a second beam from each of a first antenna panel and a second antenna panel of a base station radio unit, wherein each of the first antenna panel and the second antenna panel are positioned to direct the first beam to a first far field focal point, and wherein each of the first antenna panel and the second antenna panel are positioned to direct the second beam to a second far field focal point;

focusing, using a microwave lens, the first beam and the second beam onto a first near field focal point and a second near field focal point, respectively, wherein the first near field focal point and the second near field focal point are associated with a first test antenna and a second test antenna, respectively; and performing one or more measurements of at least one of the first beam or the second beam received at both of the first test antenna and the second test antenna.

9. The method of claim 8, wherein the first beam transmits in a first spatial direction and the second beam transmits in a second spatial direction separated from the first spatial direction.

10. The method of claim 8, wherein the first antenna panel and the second antenna panel each operates in one or more fifth generation frequency range 2 frequency bands.

11. The method of claim 8, wherein the microwave lens is formed of at least one of:
polytetrafluoroethylene,
high-density polyethylene resin,
nylon,
polystyrene, or
acrylonitrile butadiene styrene.

12. The method of claim 8, wherein at least one of the first test antenna or the second test antenna comprises:
a dual polarized antenna.

13. The method of claim 8, wherein the microwave lens comprises:
a plurality of binary zoned plates, or
a plurality of graded zoned plates.

14. The method of claim 8, wherein the first antenna panel and the second antenna panel each operate a different component carrier.

15. A base station test system, comprising:
a base station radio unit configured with a plurality of antenna panels positioned in a test chamber,
wherein the plurality of antenna panels includes a first antenna panel and a second antenna panel that are each configured to transmit a first beam to a first far field focal point, and to transmit a second beam to a second far field focal point;
a plurality of test antennas positioned adjacent to the plurality of antenna panels in the test chamber,
wherein the plurality of test antennas includes a first test antenna and a second test antenna associated with a first near field focal point and a second near field focal point, respectively; and
a microwave reflector positioned to focus the first beam and the second beam, transmitted from both of the first antenna panel and the second antenna panel, toward the first near field focal point and the second near field focal point, respectively, based on steering of the plurality of antenna panels.

16. The base station test system of claim 15, wherein a distance between the plurality of antenna panels and the plurality of test antennas is less than a Fraunhofer distance of the plurality of antenna panels.

17. The base station test system of claim 15, wherein the plurality of test antennas comprise:
a plurality of dual polarized antennas.

18. The base station test system of claim 15, wherein the first antenna panel has a vertical polarization;
wherein the second antenna panel has a horizontal polarization; and
wherein a test antenna of the plurality of test antennas is polarized to align with the vertical polarization of the first antenna panel and to align with the horizontal polarization of the second antenna panel.

19. The base station test system of claim 15, wherein the plurality of antenna panels each operates in one or more fifth generation frequency range 2 frequency bands.

20. The base station test system of claim 15, wherein the plurality of antenna panels each operates a different component carrier.

* * * * *